(12) United States Patent　　　　(10) Patent No.:　US 12,684,737 B2
　　Jenkins et al.　　　　　　　　(45) **Date of Patent:　*Jul. 14, 2026**

(54) SEALED RACK SERVER COOLING UNIT

(71) Applicant: Nexalus Limited, Cork (IE)

(72) Inventors: Richard Jenkins, Cork (IE); Michel Lebon, Cork (IE); Anthony Robinson, Cork (IE); Cathal Wilson, Cork (IE); Sara Battaglioli, Dublin (IE)

(73) Assignee: Nexalus Limited, Cork (IE)

( * ) Notice: Subject to any disclaimer, the term of this patent is extended or adjusted under 35 U.S.C. 154(b) by 261 days.

This patent is subject to a terminal disclaimer.

(21) Appl. No.: 18/585,384

(22) Filed: Feb. 23, 2024

(65) Prior Publication Data

US 2024/0407140 A1　　Dec. 5, 2024

Related U.S. Application Data

(63) Continuation-in-part of application No. 18/204,029, filed on May 31, 2023, now Pat. No. 12,507,383.

(51) Int. Cl.
H05K 7/20　　　　(2006.01)

(52) U.S. Cl.
CPC ......... H05K 7/20609 (2013.01); H05K 7/202 (2013.01); H05K 7/20272 (2013.01); H05K 7/20636 (2013.01)

(58) Field of Classification Search
CPC .......... H05K 7/20772; H05K 7/20781; H05K 7/20272; H05K 7/20345; H05K 7/20609; H01L 23/4735; G06F 1/20
See application file for complete search history.

(56) References Cited

U.S. PATENT DOCUMENTS

| | | | | |
|---|---|---|---|---|
| 12,507,383 | B2 * | 12/2025 | Jenkins | H05K 7/20772 |
| 2004/0221604 | A1 * | 11/2004 | Ota | H05K 7/20781 |
| | | | | 361/691 |
| 2011/0303394 | A1 | 12/2011 | Branton | |
| 2012/0253571 | A1 * | 10/2012 | Yun | H05K 7/20872 |
| | | | | 363/141 |
| 2014/0085808 | A1 * | 3/2014 | Tung | H05K 9/0007 |
| | | | | 361/679.47 |
| 2015/0048950 | A1 * | 2/2015 | Zeighami | H05K 7/20781 |
| | | | | 340/618 |

(Continued)

FOREIGN PATENT DOCUMENTS

| | | | |
|---|---|---|---|
| CN | 211297498 U | * | 8/2020 |
| WO | 2022112329 | | 6/2022 |

OTHER PUBLICATIONS

Lebon M. et al., "Design and characterization of a sealed hybrid-cooled high performance computer server," 2022 28th International workshop on Thermal Investigations of ICS and Systems, (Therminic), IEEE, Sep. 20, 2022, pp. 1-4.

(Continued)

*Primary Examiner* — Zachary Pape
(74) *Attorney, Agent, or Firm* — Stephen T. Scherrer; Monique A. Morneault; Scherrer Patent & Trademark Law, P.C.

(57) ABSTRACT

A sealed server unit is described. The server unit utilises a combination of air and liquid cooling to effect a cooling of the electronic components within the server unit. By sealing the unit to ambient conditions it is possible to deploy the server unit in non-traditional environments.

20 Claims, 19 Drawing Sheets

(56) References Cited

U.S. PATENT DOCUMENTS

| | | | |
|---|---|---|---|
| 2015/0062806 A1 | 3/2015 | Shelnutt et al. | |
| 2015/0109730 A1 | 4/2015 | Campbell et al. | |
| 2015/0373882 A1 | 12/2015 | Smith | |
| 2021/0071855 A1* | 3/2021 | Pan | F21V 23/045 |
| 2024/0090162 A1* | 3/2024 | Hyland | H05K 7/1497 |

OTHER PUBLICATIONS

Battaglioli S. et al., "Enhancement of an Open Compute Project (OCP) server thermal management and waste heat recovery potential via hybrid liquid-cooling," 2022 28th International Workshop on Thermal Investigations of ICS and Systems (Therminic), IEEE, Sep. 28, 2022, pp. 1-4.
ISR/WO from corresponding PCT/EP2024/064132.

* cited by examiner

113

100

111

SEALED RACK SERVER COOLING UNIT

TECHNICAL FIELD

The present application relates to server units, and in particular to server units that employ hybrid air and liquid cooling to effect cooling of the components within the server. In certain aspects, the invention relates to edge server units which are configured to be used externally of traditional data centers and can be deployed in non-controlled climatic conditions.

BACKGROUND

Electronic components generate heat when performing their electrical service. Some computer components, like CPUs and GPUs can generate a tremendous amount of heat in a relatively small area. If this heat is not extracted effectively, the chips will heat to unsafe temperatures and fail.

Within a sever unit which confines a large number of electronic components within an enclosure this can be more problematic. Server units typically include a number of different types of electronic components such as processors, RAM, hard drives, network ports and the like. When all housed within the same enclosure these collectively generate heat, which needs to be dissipated to maintain optimal operating conditions Historically, the main coolant used for cooling electronics is air. Due to the poor thermophysical properties of air, metal finned heat sinks and fans are often also employed in order to sufficiently cool the chips. However, many of today's components are generating so much heat that pure air cooling is no longer feasible.

In addition, server units are being deployed in more hazardous environments and it is becoming more and more challenging to maintain their operating performances within these environments. This is particularly the case in the context of edge computing where there is a need to provide computing hardware that can be deployed externally of centralized computing nodes and as such can aggregate and process data locally so as to reduce network bandwidth and provide expanded processing at the point of data collection. These environments have traditionally presented too many challenges in terms of external climatic and ambient conditions to allow any significant deployment of server type processing outside of data centers and other controlled environments.

SUMMARY

Accordingly, a first embodiment of the application provides a server unit as detailed in claim 1. Advantageous embodiments are provided in the dependent claims.

BRIEF DESCRIPTION OF THE DRAWINGS

The present application will now be described with reference to the accompanying drawings in which.

DETAILED DESCRIPTION

Figure 1:
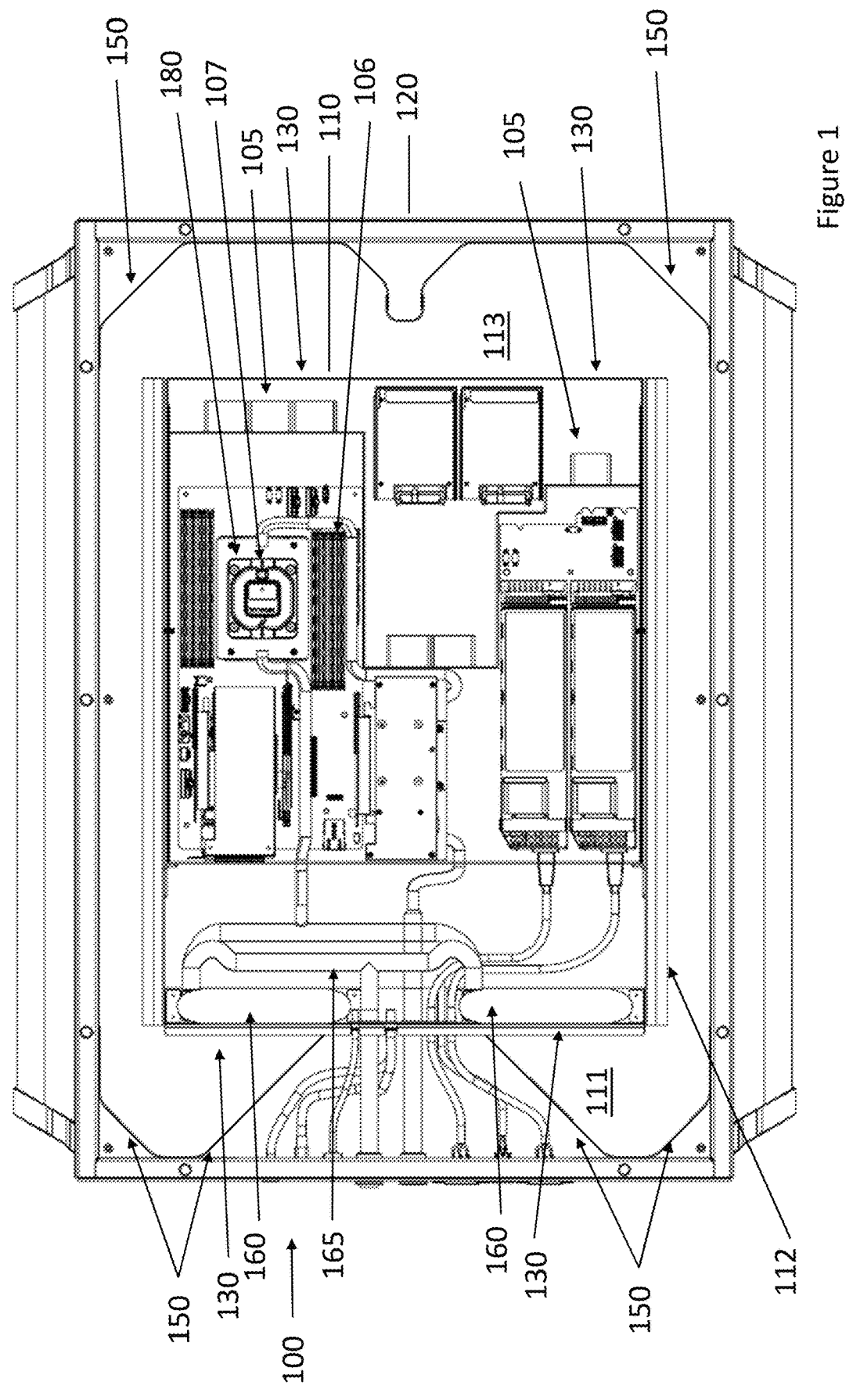
FIG. 1 is a top view of a server unit with a top cover removed in accordance with the present teaching.
Figure 2:
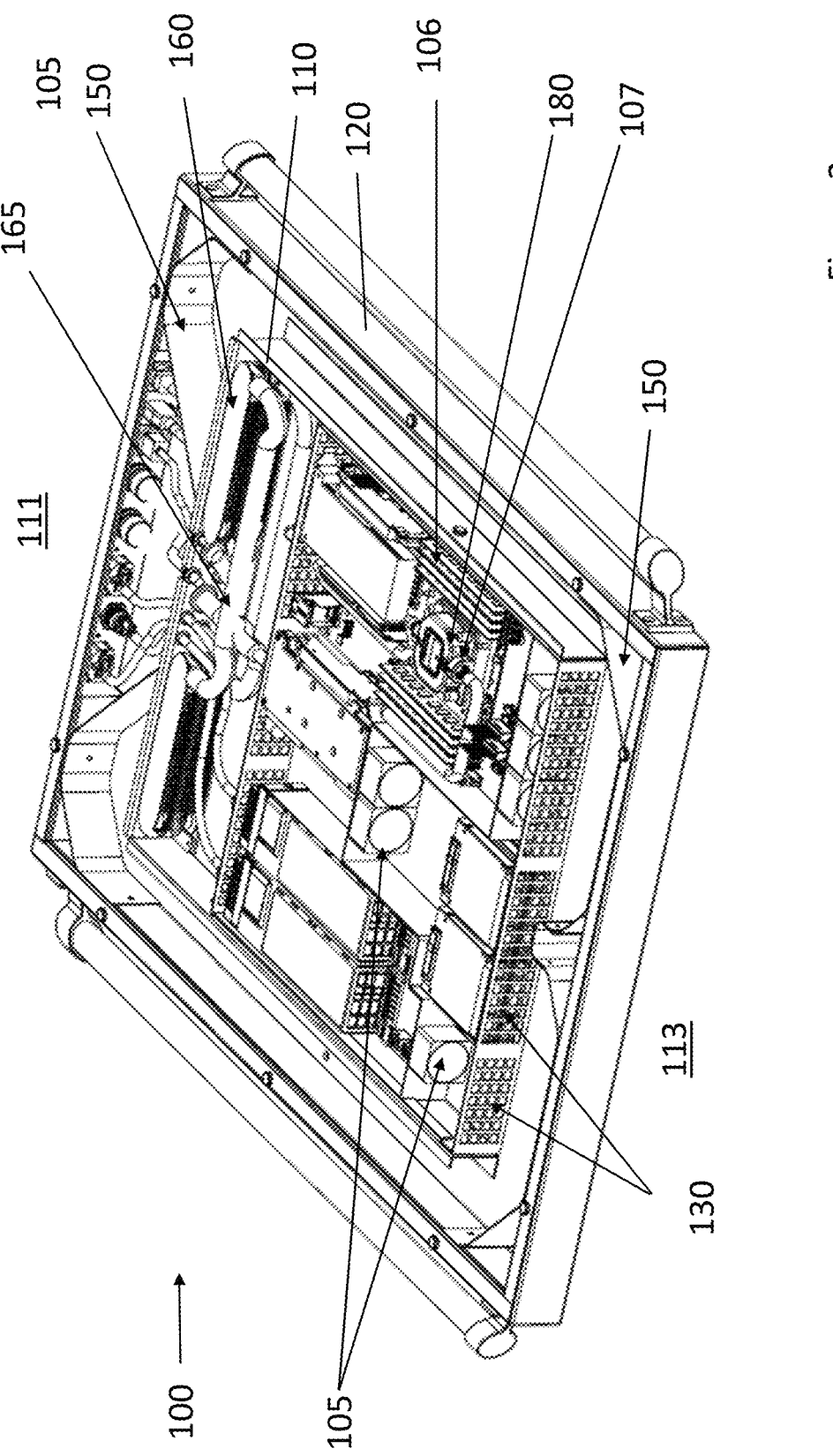
FIG. 2 is a perspective view of the server unit of FIG. 1.
Figure 3:
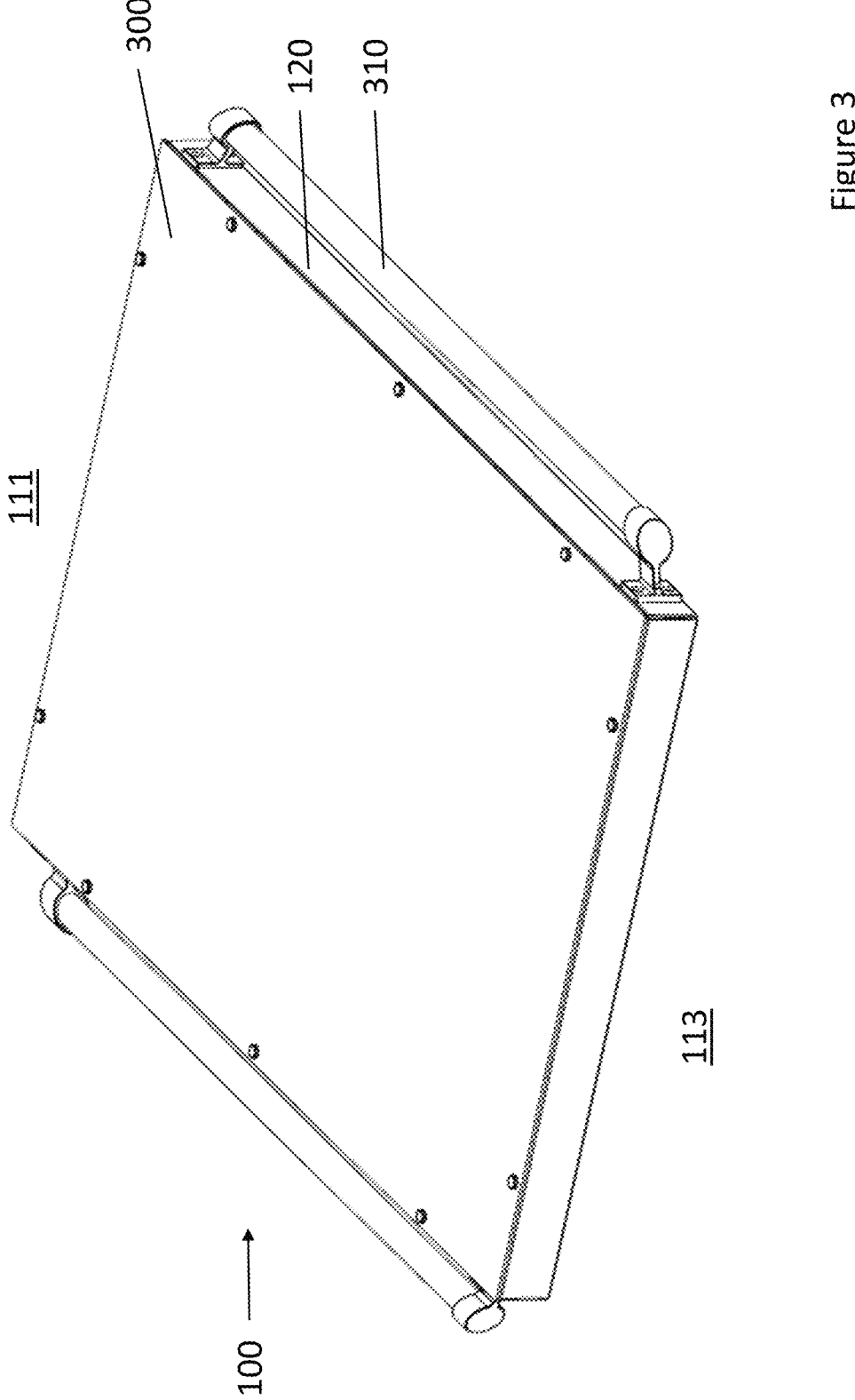
FIG. 3 is an external view of the unit of FIGS. 1 and 2.

FIGS. 1 to 3 show an example of a server unit 100 in accordance with the present invention. The unit comprises a plurality of electronic components including at least one fan 105, memory 106, and a central processing unit 107. The server unit comprises a first enclosure 110 and a second enclosure 120. The at least one fan 105, the memory 106, and the central processing unit 107 are provided within the first enclosure 110. In effect the first enclosure 110 provides a mount for the processing components of the server and functions as a chassis for these components. As will be known by those of ordinary skill, a server by definition provides higher processing capacities than other types of computing hardware and is typically accessed over a network, such that they often are provided to run unattended—configured to be configured and managed remotely. Though not shown in FIG. 1, the server unit will typically comprise hardware that will facilitate network connection.

The first enclosure 110 is provided within the second enclosure 120. The second enclosure is sealed such that ambient air does not ingress or degress from the second enclosure 120. As the first enclosure provides the chassis for processing hardware components of the server, the location of the first enclosure 110 into the second enclosure 120 facilitates a corresponding location of these components which are fixed to the first enclosure 110 into the second enclosure.

In contrast to the second enclosure 120, the first enclosure 110 comprises air conduits 130 that are arranged so as to allow a passage of air from the first enclosure to the second enclosure, and from the second enclosure to the first enclosure. In this way the first enclosure 110 can be vented through a passage of air in and out of the first enclosure. The first enclosure is effectively provided by a set of surfaces that are arranged relative to one another to provide a volume within which the server hardware processing components can be located and fixed.

To facilitate the movement of air through the first enclosure 110, the second enclosure 120 comprises at least one baffle 150 to preferentially direct air egressing from a first end 111 of the first enclosure 110, along a side 112 of the first enclosure 110 to then enter into a second end 113 of the first enclosure 110. Air will be heated within the confines of the first enclosure by the heat emitted by the electronic components within the first enclosure. It will be appreciated that in other configurations the air exiting from the first enclosure may be directed over a top or bottom surface (or both top and bottom surfaces) of the first enclosure, as opposed to exclusively along the sides of the first enclosure.

At least one, in this exemplary embodiment two, air liquid heat exchangers 160 are located in an air flow path between the first enclosure 110 and the second enclosure 120 such that heated air passing between the first enclosure and the second enclosure passes through the air liquid heat exchanger to effect an extraction of the heat from the heated air.

The air liquid heat exchanger 160 is in fluid communication with a liquid coolant conduit 165. The liquid coolant conduit 165 is configured to effect a transfer of heat away from the air liquid heat exchanger 160. In this embodiment the fluid lines 165 provide fluid communication from the air heat liquid exchanger 160 to a location externally of the second enclosure 120.

The first enclosure 110 further comprises a liquid cooling unit 180 configured to direct liquid onto the central processing unit 107. The liquid cooling unit 180 is also in in fluid communication with the liquid coolant conduit 165, such that heat emitted from the central processing unit 107 is also transferred into the liquid coolant conduit 165. It will be appreciated that the use of additional liquid cooling units is also envisaged. For example if multiple processing units are provided within the server, then each may require its own dedicated cooling. The use of the liquid cooling units is not reserved for only central processing units, as graphic processing units for example also generate significant quantities of heat and within the context of the present teaching may benefit from direct liquid cooling.

Desirably the liquid cooling unit comprises a jet impingement plate such as that described in our earlier patent application PCT/EP2021/082822, the content of which is expressly incorporated herein by way of reference. By using a jet impingement plate providing a plurality of jet orifices, it is possible to effect a direct cooling of the thermal surface of the CPU, by dissipating heat away from the thermal surface.

Using a server unit per the present teaching ensures that the air volume within the first 110 and second 120 enclosures is a fixed air volume. As is evident from the top view shown in FIG. 3, the unit 100 is a closed box when viewed externally. In FIG. 3, a lid 300 is located on the top of the server unit enclosures to effect the sealing. Handles 310 may be provided to facilitate a transportation of the unit.

Air can circulate within the shared volume between the first and second enclosures, but that air does not pass out of the sealed second enclosure, that being sealed such that ambient air does not ingress or degress externally from the second enclosure. The heat is ultimately conveyed out of the first and second enclosures via the liquid coolant within the coolant conduit 165. As a result of the sealing of the second enclosure, dirt or other contaminants within the environment external to the second enclosure cannot enter into the second enclosure. This sealing from the ambient environment permits the deployment of server units in accordance with the present teaching in non-traditional environments. For example units in accordance with the present teaching can be deployed outside as the internal electronic components are sealed from the ambient weather. As hermetically sealed units, for example IP 67 rated units, they can therefore be deployed externally of server farmers, data centres and the like. Edge deployments providing server processing capabilities are therefore enabled. Other deployment environments include those on-board vehicles where for example, the liquid coolant conduit could be provided in fluid communication with the vehicle cooling system to effect a cooling of the heat discharged from within the server unit.

Figure 4:
FIG. 4 shows a CFD simulation of the heat within the unit of FIG. 1 or 2.

FIG. 4 shows the result of CFD simulations looking at thermal and air flow currents within the first and second enclosures. This included both thermal and fluid dynamic simulations for the air and water circulation inside the system, along with heat transfer in relevant solids including the heat exchangers and key electronic components. There are pockets of heat around each of the main processing components—specifically the CPU and GPU, but even in these regions the temperature was below 30 degrees. The CFD predictions illustrate a similar flow pattern compared with a standard server unit stock scenario, apart from the front-to-back flow bypass. For a simulated maximum CPU power of 225 W and GPU power of 75 W, commensurate with the maximum power measured for a standard server system, the average above-ambient CPU and GPU core temperatures were predicted to be 25° C. and 15° C., notably cooler than predicted for the stock scenario.

These values will be contrasted with conventional server operations in each of FIGS. 8 to 11, which will be discussed in more detail below.

Figure 5:
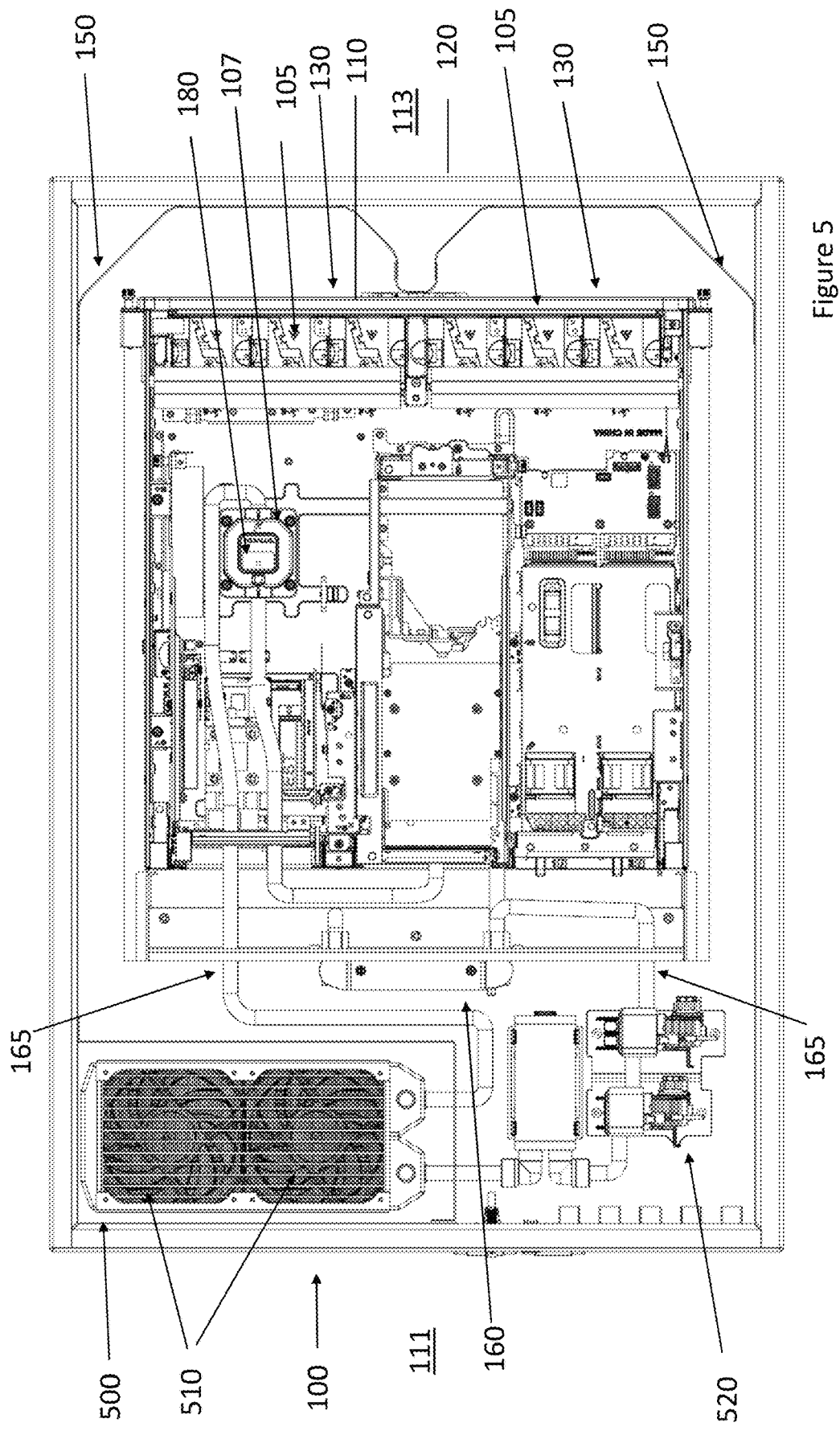
FIG. 5 is a top view of a server unit with a top cover removed in accordance with a second embodiment per the present teaching.
Figure 6:
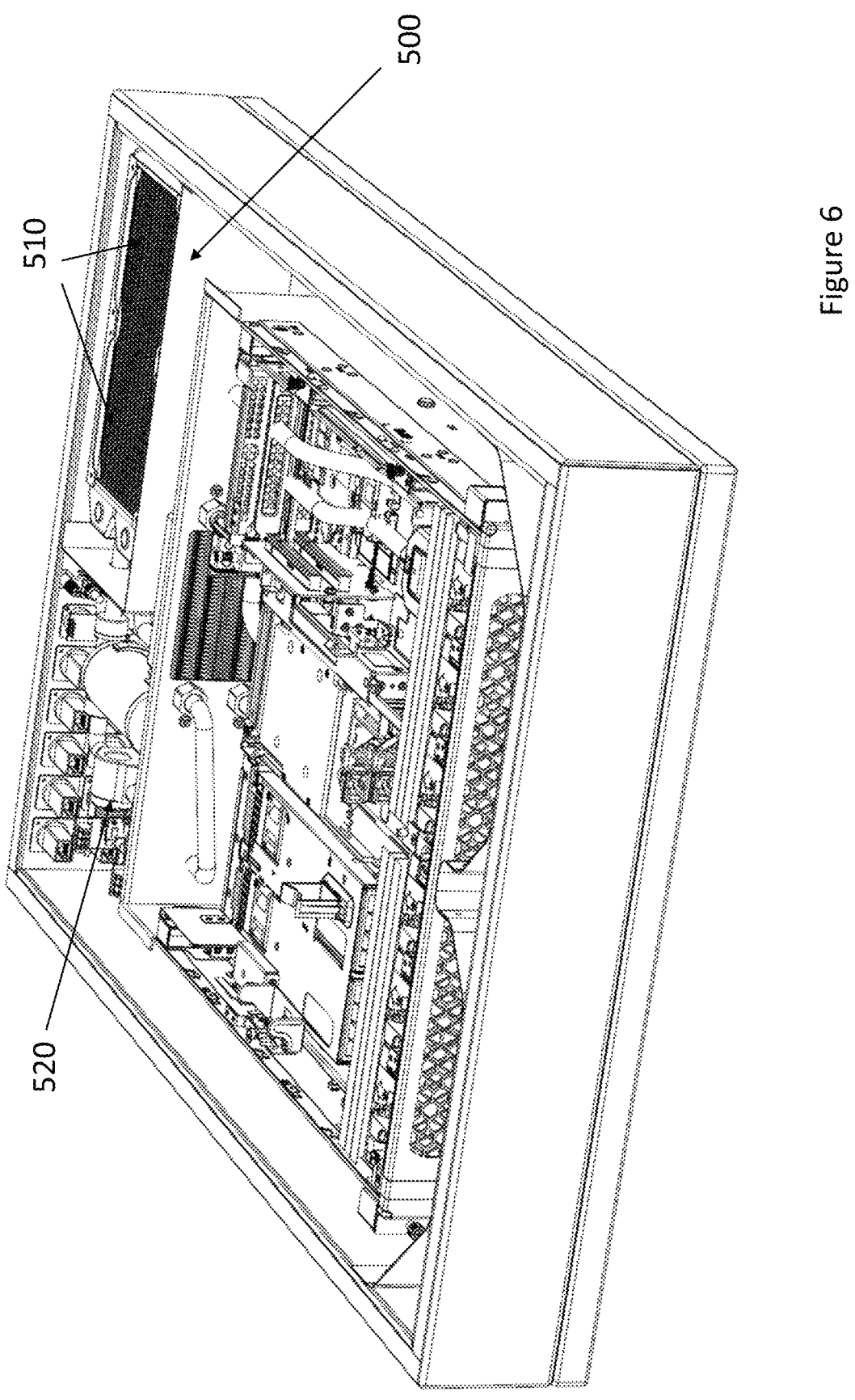
FIG. 6 is a perspective view of the server unit of FIG. 5.
Figure 7:
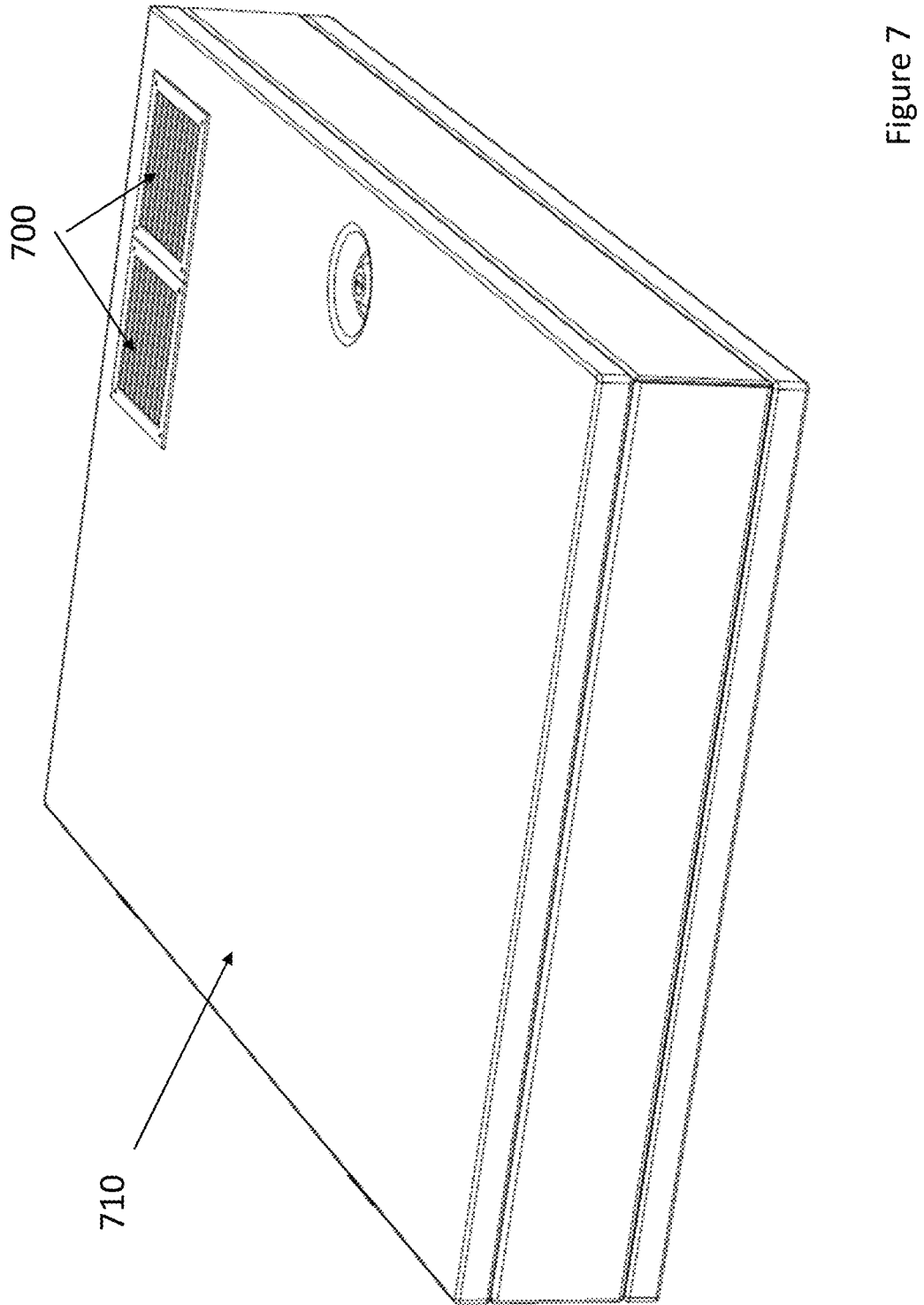
FIG. 7 is an external view of the unit of FIGS. 5 and 6.

FIGS. 5-7 show a second embodiment of the server unit in accordance with the present teaching. In this example, the same reference numerals will be used for parts already discussed with reference to FIGS. 1 to 3. This embodiment also includes first and second enclosure which share a common sealed air volume. The embodiment differs in that a third enclosure 500, wholly defined within the second enclosure 120 is provided. Within this third enclosure 500, air liquid heat exchangers 510 are provided. Fluid transported out of the first and second enclosures via the fluid conduits 165 passes into thermal contact with the heat exchanger 510 where it is cooled by a fan assisted extraction of heat. The heated air is then vented externally of the third enclosure—which is open to ambient air, as can be seen from the external view of FIG. 7 where the vents 700 in the top cover 710 are evident. Whilst the third enclosure is open to ambient conditions, each of the first and second enclosures are sealed—per FIGS. 1 to 3. Air circulates between the first and second enclosures in a similar fashion to that described above, and again similarly the totality of the heat generated in these enclosures is extracted out of these enclosures within the fluid conduits 165.

A pumping arrangement 520 is provided to assist in the movement of the fluid through the fluid conduits through a flow and return circuit—the flow circuit delivering heated fluid from the first and second enclosures to the heat exchanger 510, the return circuit returning cooled liquid from that heat exchanger 510 back into the first and second enclosures.

Figure 8:
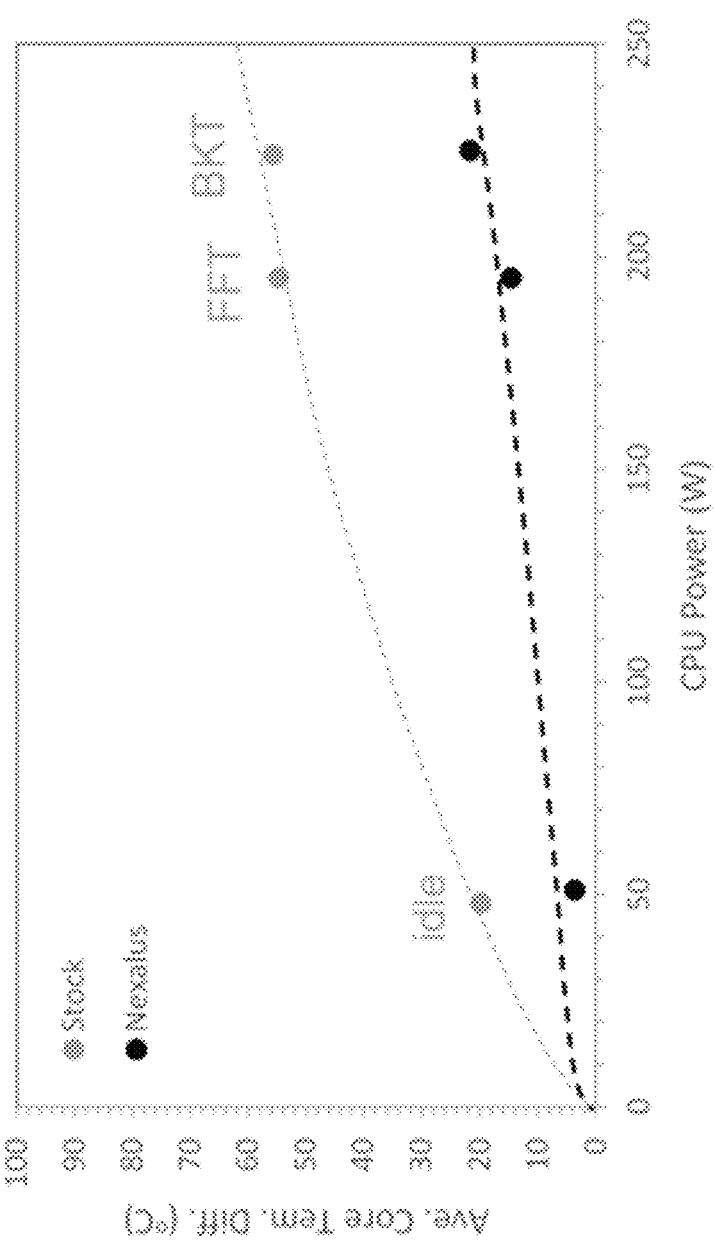
FIG. 8 is the result of experimental data comparing temperature performance of a CPU within a server unit per the present invention as compared to that within a conventional unit.
Figure 9:
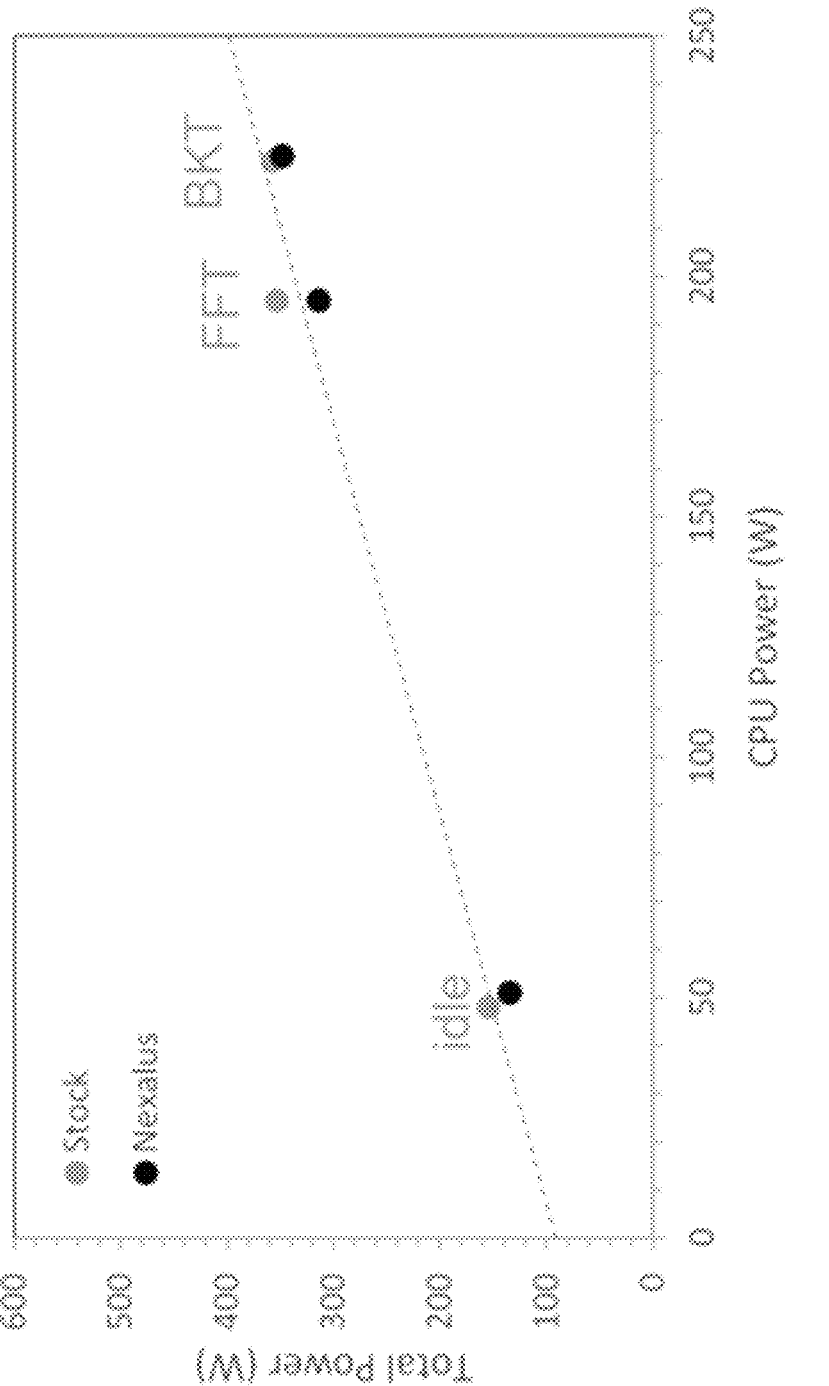
FIG. 9 shows the comparable power utilisation of the two CPU's referenced in FIG. 8.

Steady-state experiments were performed on a unit per the present invention. FIG. 8 shows the measured above-ambient average CPU core temperature for the idle, as well as FFT and BKT algorithms for the CPU-only stress cases. As shown, the CPU core temperature escalates with increasing CPU power, with a unit per the present teaching being between 34-40° C. cooler than a conventional cooling architecture when under stress, reaching an average CPU above-ambient temperature of 22° C. at the maximum achievable power of 225 W. FIG. 9 shows a linear relationship between the total server power with increasing CPU power for the CPU-only stress tests, and the server unit per the present invention does not require additional power compared with the conventional system.

Figure 10:
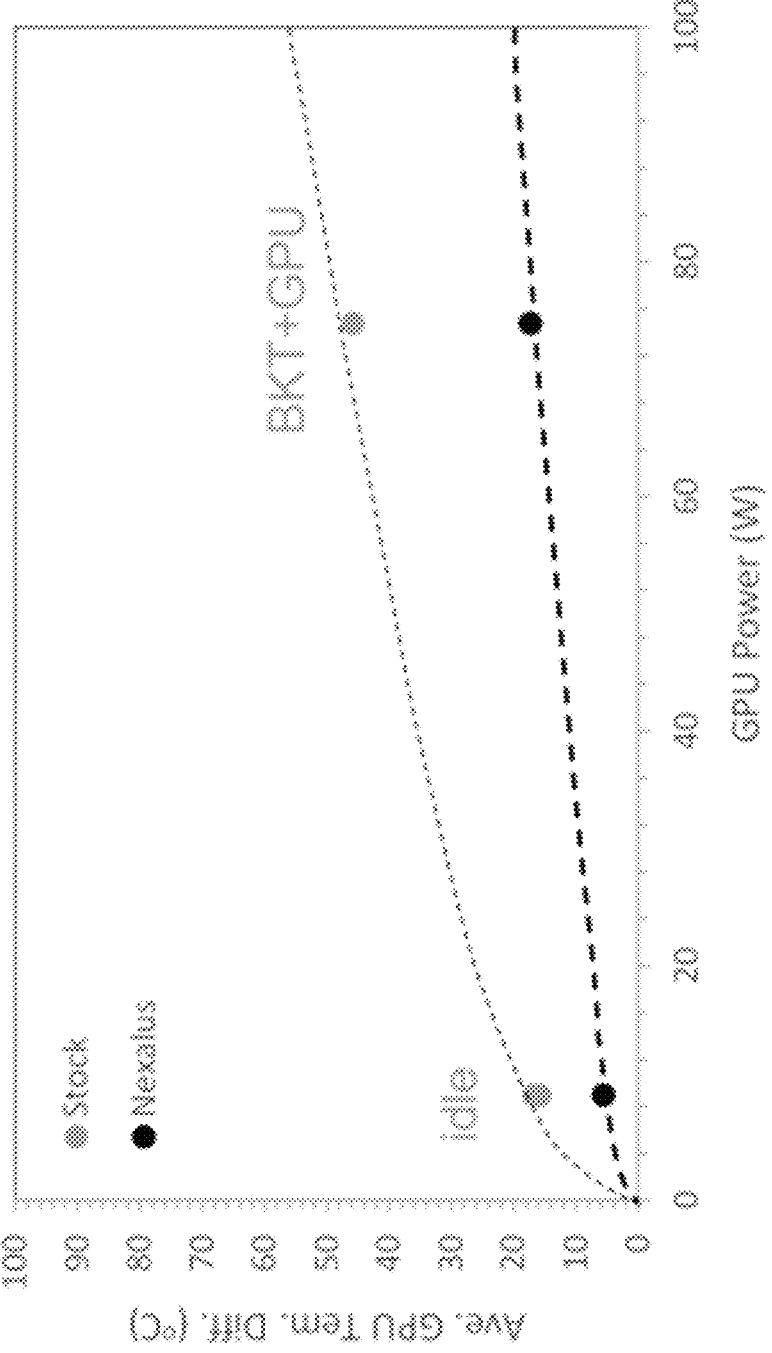
FIG. 10 is the result of experimental data comparing temperature performance of a GPU within a server unit per the present invention as compared to that within a conventional unit.

Additionally, FIG. 10 shows a similar level of augmented cooling for the GPU stress test, with a 34° C. lower operating temperature than the stock server at 75 W power. Similarly, the same conclusion can be drawn considering FIG. 11 for the CPU+GPU stress tests, though the total power is noticeably higher for both retrofitted and stock cases owing to the additional workload of the graphics card.

Figure 11:
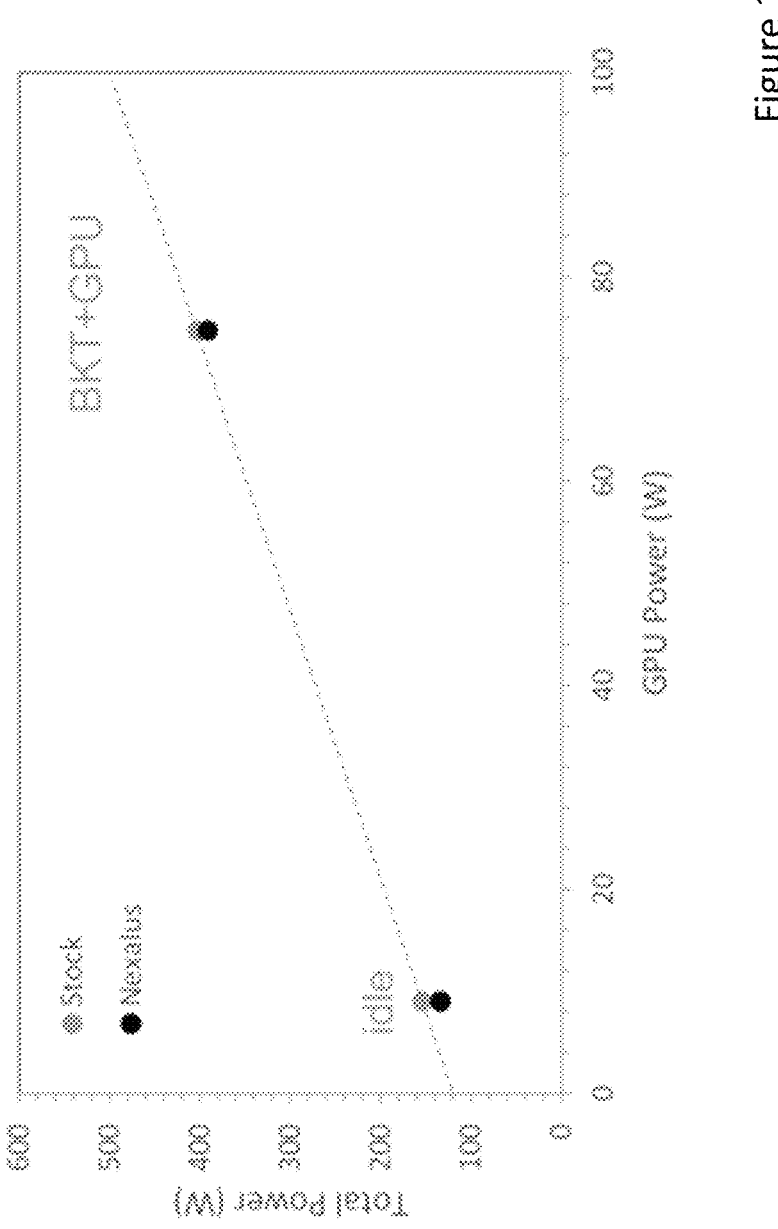
FIG. 11 shows the comparable power utilisation of the two GPU's referenced in FIG. 10.

It will be appreciated that the data of FIGS. 8-11 is similar in that FIGS. 8 and 9 show average above-ambient CPU core temperature variation with total CPU power in a CPU-only stress tests whereas FIGS. 9 and 11 show experimental average above-ambient GPU core temperature variation with total GPU power in a CPU+GPU stress test.

Figure 12:
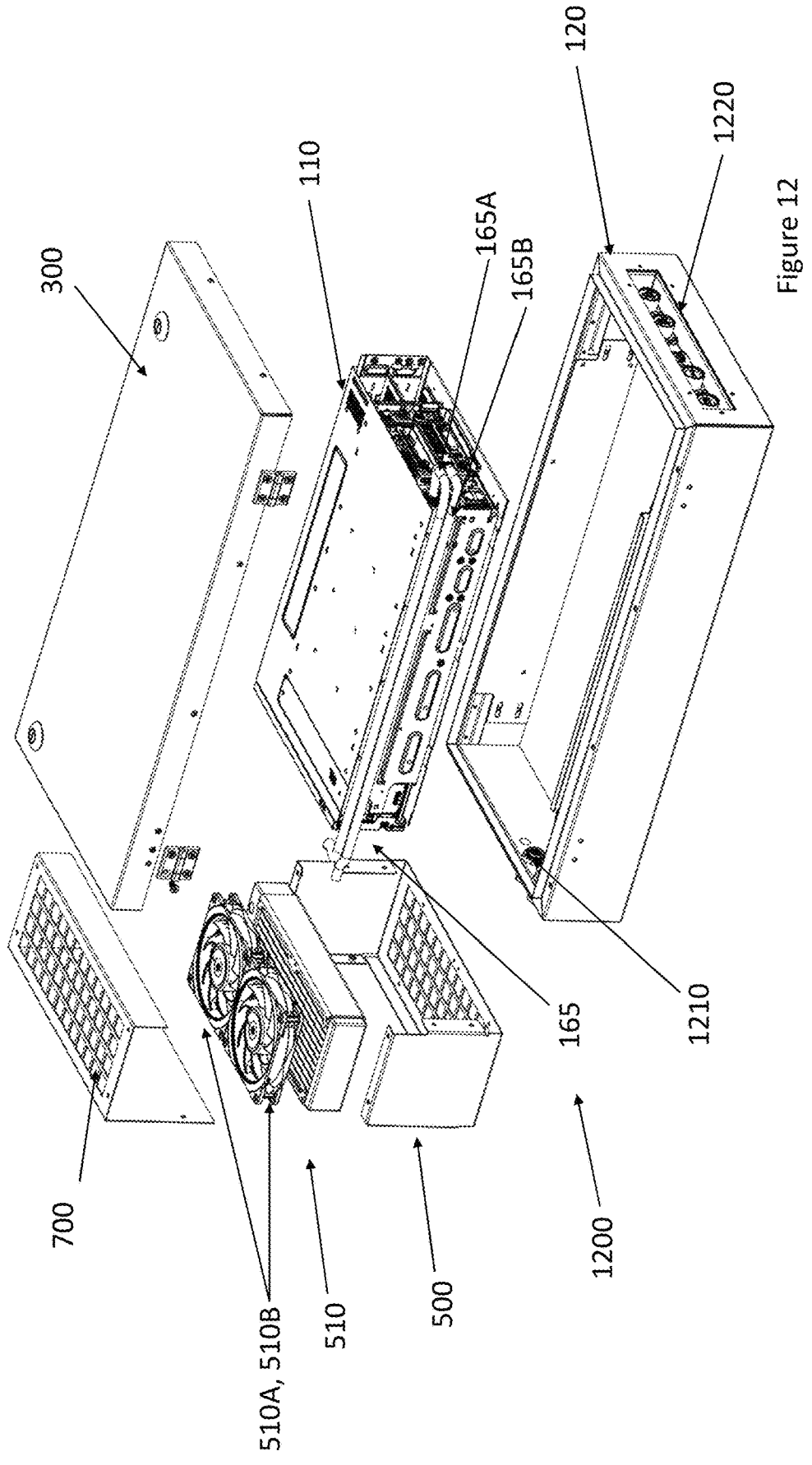
FIG. 12 is an exploded view of another embodiment of a server unit in accordance with the present invention.

FIG. 12 is another embodiment of a server unit in accordance with the present teaching. Again, the same reference numerals will be used for previously referenced components. The server unit 1200, comprises a first enclosure 110 which similarly to that described previously includes server processing hardware components. The first enclosure 110 is dimensioned to be received within the volume defined by the second enclosure 120. Similarly to that previously described air can pass between the first and second enclosures, but the second enclosure 120 is hermetically sealed to create a fixed volume of air—such that the components mounted within the first enclosure are not exposed to ambient air and dust from externally of the second enclosure 120. As was described previously, the heat output from these components is conveyed into a liquid coolant conduit 165 which is configured to effect a transfer of heat externally of the first and second enclosures. As per the previous described embodiments, this liquid coolant conduit comprises a flow and return circuit 165A, 165B which are in fluid communication with a heat exchanger 510 located externally of the second enclosure—within a third enclosure 500. The heat exchanger 510 is located proximal to fans 510A, 510B which effect discharge of that heat externally of the third enclosure via vents 700. In this embodiment, vents are provided above and below the heat exchanger 510 so as to allow a drawing of fan assisted air through the third enclosure to effect a cooling of the heat exchanger 510.

Differently to the arrangement previously described, in this embodiment there are no specific baffles provided within the second enclosure, but the air passing through the first enclosure into the second enclosure can pass around the external surfaces of the first enclosure.

Whilst not shown, the internal cooling of the components within the first enclosure can be effected in a similar manner to that previously described—through a combination of direct liquid cooling and also through fan assisted distribution of air that through the enclosure that will then pass through air/liquid heat exchangers for extraction of that heat. To cool all supporting electronics of the server, the air within the sealed second enclosure—and as a result the sealed first enclosure—circulates through this internal enclosure and across the internally provided heat exchangers. In this process, the collected heat is transferred to the liquid coolant.

Once the heat generated by the server is transferred to the liquid coolant stream, it is directed out of the sealed (e.g. IP66 rated) compartment to the ambient-exposed heat rejection unit (The heat exchanger 510 is located proximal to fans 510A, 510B). Here, the coolant passes through the heat exchanger which may include a heat rejection radiator, dissipating all the heat generated within the sealed server compartment to the ambient surrounding air.

The second enclosure 120 can be accessed through a hinged lid 300, which when closed creates a sealed environment.

The liquid conduits 165 can pass through the second enclosure 120 into the third enclosure 500 through ports 1210 which are dimensioned such that when the conduits pass through the port, a seal about the outer surface of the conduits 165 is formed. Similarly the provision of power and power and data interfaces to the electrical components within the first enclosure can be provided by one or more connectors 1220 that are provided in a side surface of the second enclosure 120. These connectors are desirably IP rated to maintain the desired sealed volume within the second enclosure.

Figure 14:
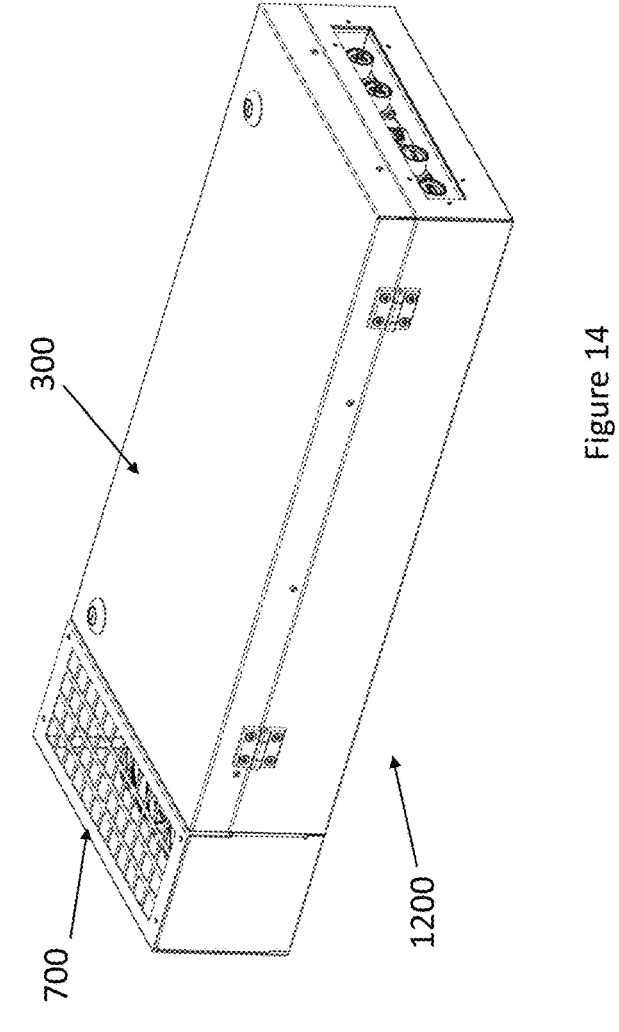
FIG. 14 shows the unit of FIG. 12 in a closed horizontal orientation.
Figure 13:
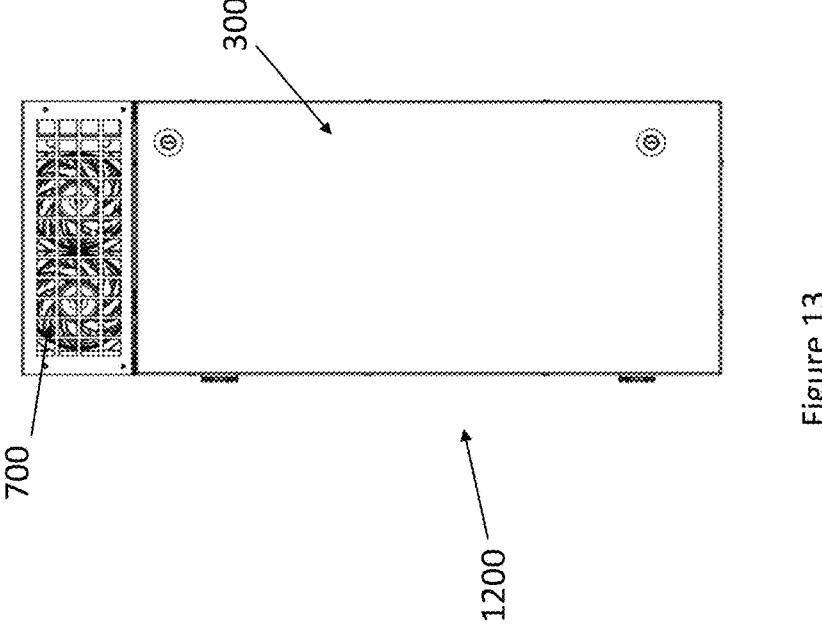
FIG. 13 shows the unit of FIG. 12 in a closed vertical orientation.
Figures 15, 16:
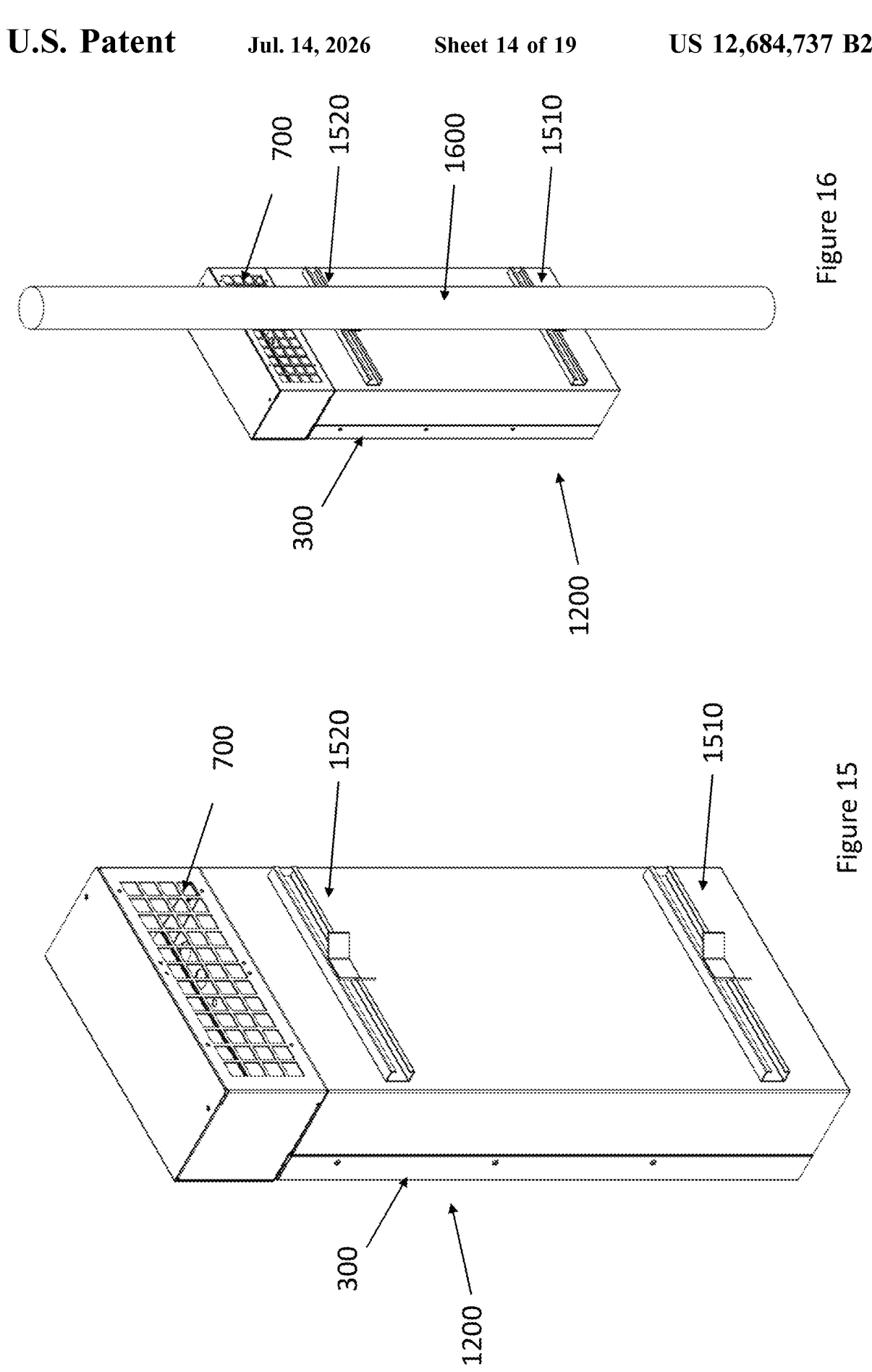
FIG. 15 shows a rear perspective of the unit of FIG. 13.
FIG. 16 shows the unit of FIG. 13 when mounted to a pole.

FIGS. 13 and 14 show the unit of FIG. 12 in a closed configuration, with FIG. 14 showing the unit lying horizontally while FIG. 13 shows it in a vertical configuration. The vertical configuration is particularly advantageous as will now be described with reference to FIGS. 15 and 16. As was discussed previously, one specifically advantageous use of the server units of the present teaching is that they can be deployed in an outdoor environment as they can for example be IP65 or higher rated—they are sealed units and can therefore be deployed externally of server farmers, data centres and the like. Edge deployments providing server processing capabilities are therefore enabled. The unit of FIG. 12-16 is a specific example of this edge computing deployment where the unit can be vertically mounted. As shown in FIGS. 15 and 16, mounting brackets 1510, 1520 which are fixed to the unit allow an attachment of the unit to a pole 1600 or some other external fixture. It will be appreciated that these brackets and the pole are exemplary of the type of mount that can be used to fix the server unit and are particularly advantageous where the sever is to be used in a telecommunications environment where it can be coupled to a telecommunications pole or mast. It will be appreciated that such poles or masts are typically provided in such infrastructure to provide a mount for telecoms antenna or the like. With a server unit per the present teaching, the sever unit can be deployed proximal to the actual telecoms infrastructure, and as such there is a possibility to provide enhanced data processing at the point of transmission or reception of data, something that heretofore was not practical.

It will also be seen from FIGS. 15 and 16, that the third enclosure is provided in this configuration above the second enclosure—to the top of the unit. In this way heat that is generated within the unit will pass out of the third enclosure at the top of the unit and as such will naturally convect away from the unit.

Figure 17:
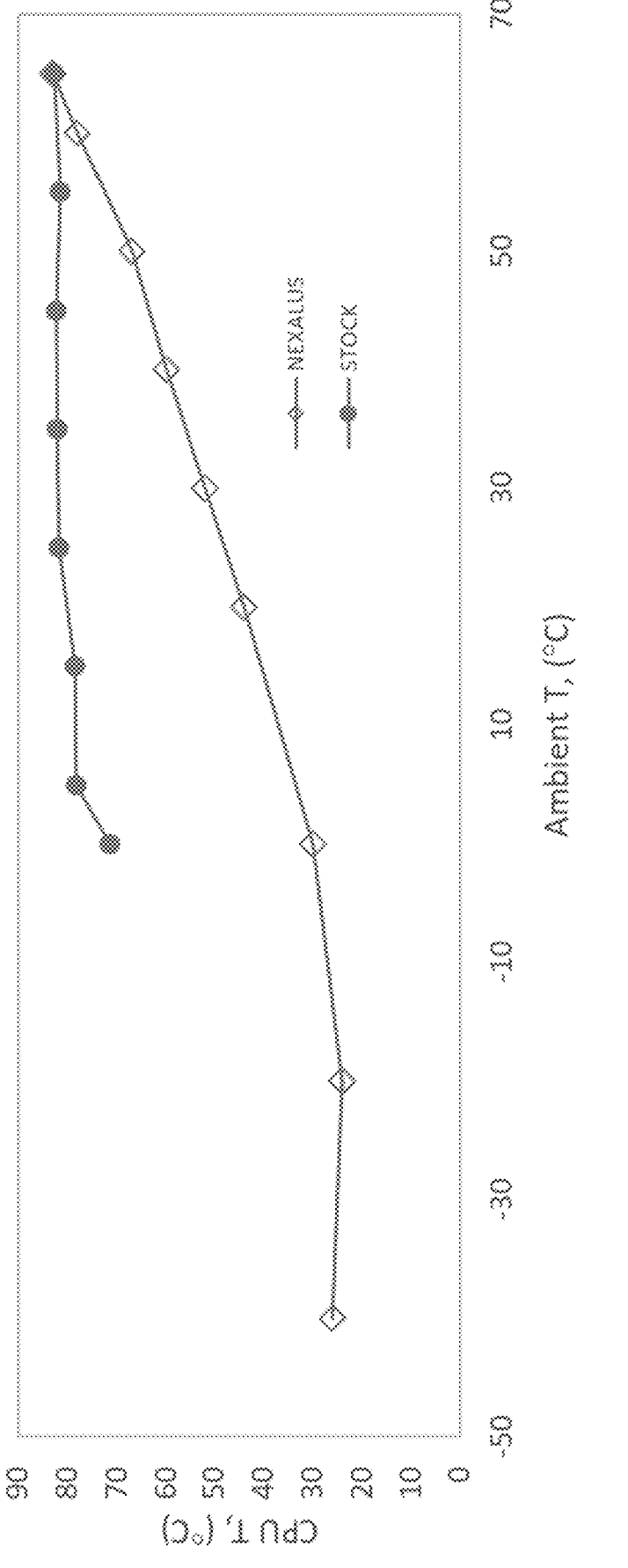
FIG. 17 is the result of experimental data comparing temperature performance of a CPU within a server unit per the present invention as compared to that within a conventional unit.
Figure 18:
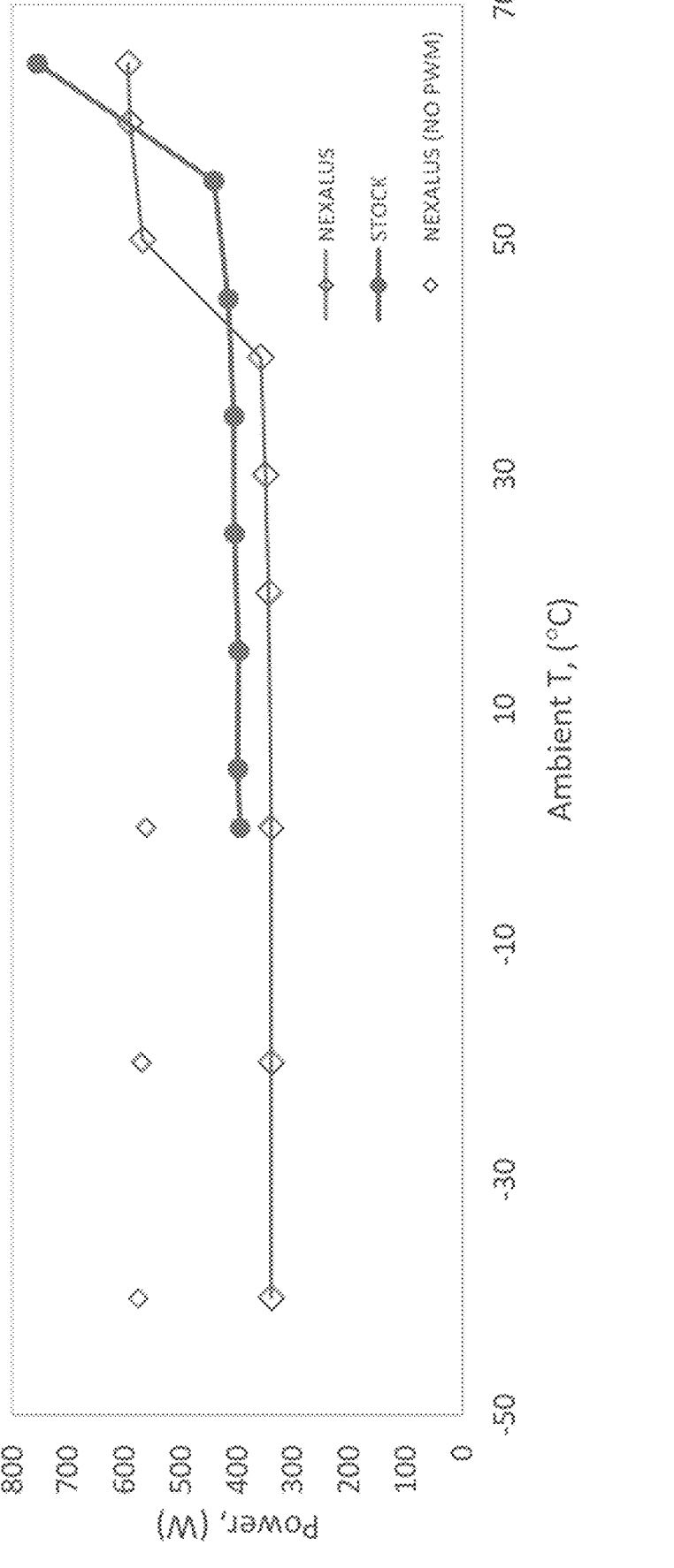
FIG. 18 is the result of experimental data comparing power consumption over a temperature range for a server unit per the present invention as compared to that of a conventional unit.

FIGS. 17 and 18 show comparison data for a server unit provided in accordance with the present teaching verses a known stock unit when measuring both measured temperature of a CPU for a variety of external ambient temperatures (FIG. 17). FIG. 17 shows comparable data for total power consumption over the same test ambient range (FIG. 18). At an ambient temperature of 20° C., the Stock Server exhibited a core temperature of 83° C., while the unit of the present invention (the labelled Nexalus unit) which benefits from water-cooling technology, achieved a markedly lower core temperature of 44° C. Impressively, the Nexalus showcased heightened energy efficiency, consuming a mere 340 W compared to the Stock Server's 398 W at 20° C., representing a significant 14.57% reduction in power consumption. Even at the upper threshold of the chamber's temperature range (65° C.), the Nexalus unit continued to surpass the Stock Server, consuming only 595 W and displaying a significant 21.03% reduction in power usage compared to the Stock Server's 756 W. Beyond its enhanced thermal and energy efficiency performance, the Nexalus unit's extended operating temperature range, spanning from –40 to 65° C., positions it as a versatile solution suitable for a variety of environmental conditions.

Figure 19:
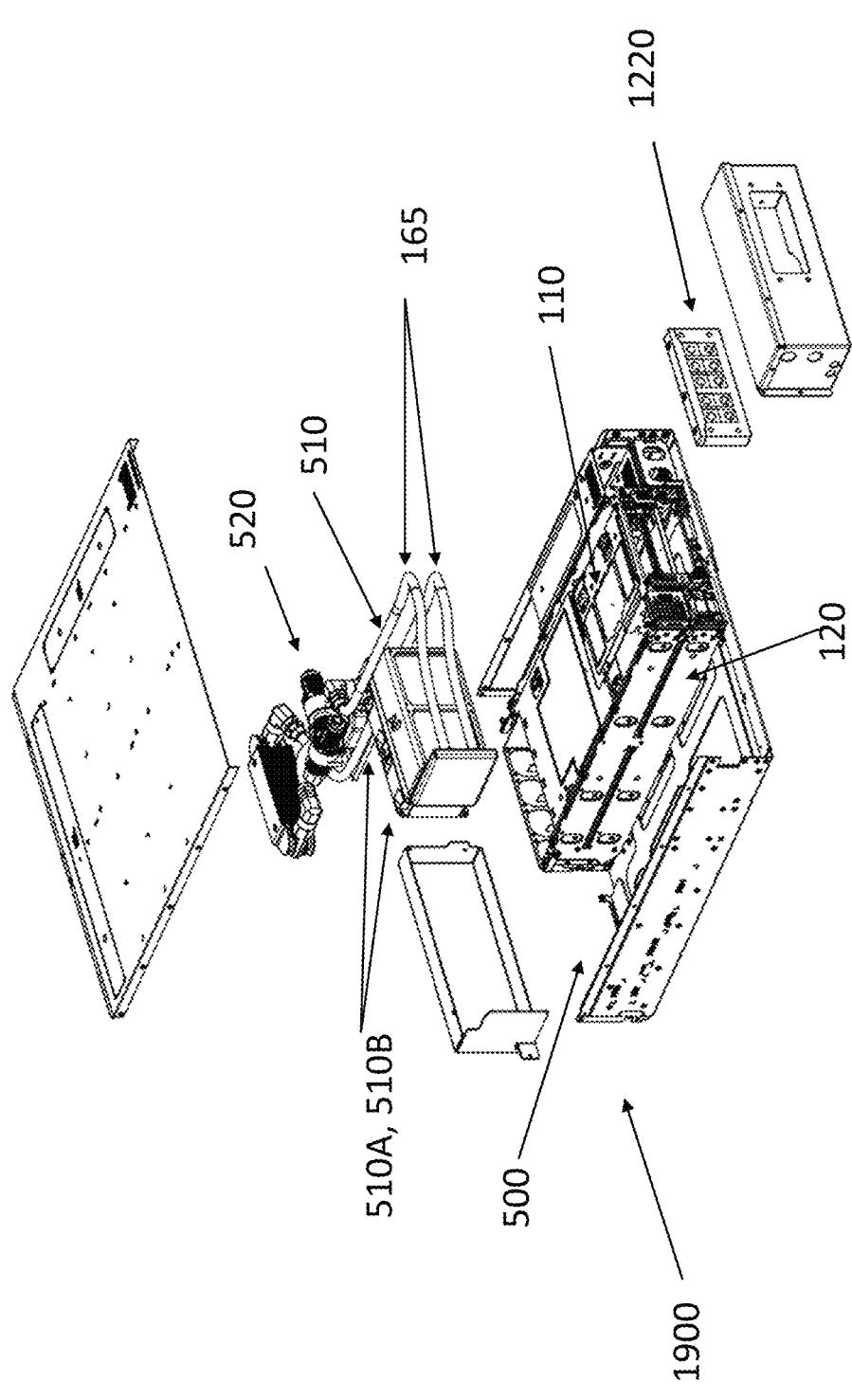
FIG. 19 shows an exploded view of another embodiment of a server unit in accordance with the present invention.
Figure 20:
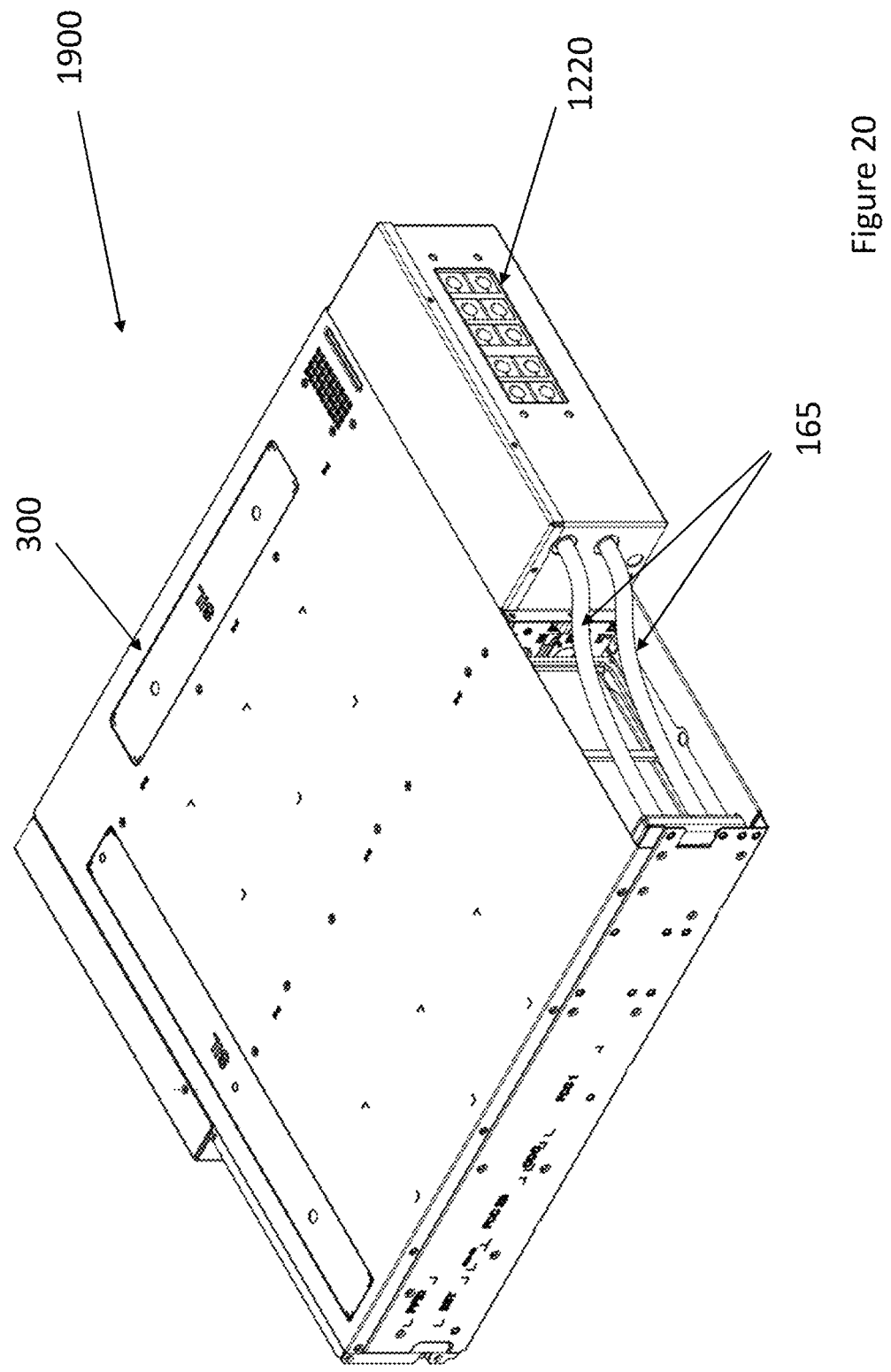
FIG. 20 shows the unit of FIG. 19 when assembled.
Figure 21:
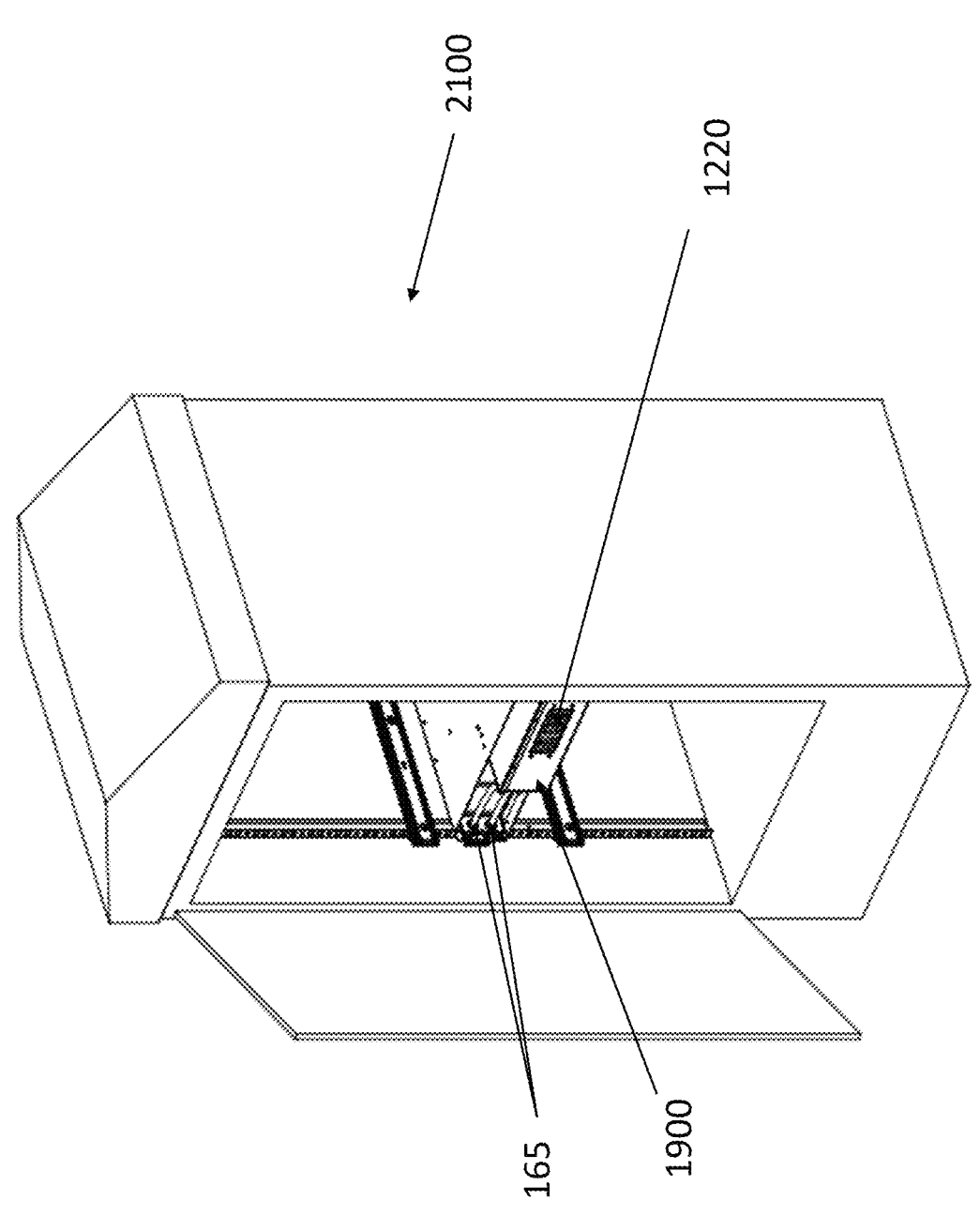
FIG. 21 shows the unit of FIGS. 19 and 20 when located within a roadside cabinet.

FIGS. 19 and 20 show another embodiment of a server unit 1900 in accordance with the present teaching. Again the same reference numerals will be used for similar parts. This unit also includes server processing components that are provided within a first enclosure 110, the first enclosure 110 being located within a second enclosure 120 which can be hermetically sealed to avoid ingress or degress of ambient air into the volume defined by the second enclosure 120. This embodiment differs from the previously described arrangement in that the third enclosure—within which heat exchangers 510 and fans 510A, 510B is located to the side of the second enclosure, as opposed to the top per the arrangement previously described. In effect this configuration occupies a larger footprint than the previous embodiments. Exemplary comparison dimensions (and it will be appreciated that the present invention is not to be construed as being limited to specific dimensions unless deemed necessary by the claims) are that this unit 1900 has full chassis dimensions: 447 mm×520 mm×85 mm (17.6"× 20.5"×3.4") whereas the previous unit—for example that of FIG. 12 has dimensions of 420 mm×190 mm×82 mm (16.5"×7.5"×3.2"), i.e. the unit of FIGS. 19 and 20 is more than two times as wide as that of FIG. 15. This configuration is particularly suited for deployment in road side cabinets 2100 and the like—as shown in FIG. 21. Given that this unit will be installed within a cabinet the requirement for high level of IP rating is not as critical as for the previously described unit, and IP55 may well be sufficient. In operation, the unit works in effectively the same manner as the units previously described. The electronic server components (CPU, memory, power supplies etc) are provided within the first enclosure 110 which is then located within the second sealed enclosure 120. Cooling for these components is effected through a combination of liquid and air cooling, but the heat that is generated is then transferred out of the second enclosure 120 through liquid conduits 165 to a heat exchanger 5210 provided externally of the second enclosure—within a third enclosure which is open to ambient conditions. That heat exchanger is then cooled through fan assisted cooling provided by one or more fans 510A, 510B. The transfer of the liquid within the liquid coolant conduit can be pumped through use of a pumping mechanism 520—as was described above.

The performance of this configuration is similar to that described above for the other configurations with improvement in both power consumption and also temperature regulation when compared to a conventional server unit.

In addition to the improved cooling that is achieved using the sealed server unit of the present teaching, noise performance was also noticeably better using units per the present teaching as opposed to air cooled only units per the known art approach. The movement of the air within the sealed units results in less noise externally of the units than would be noticeable where forced air venting to ambient per known approaches. In addition, internal noise suppression using specifically designed baffles can be incorporated. The units can also be filled with an inert atmosphere such as argon or some other inert gas to reduce the risk of any internal fire. The external casing material can also be fabricated from materials that provide RF shielding to the internal electronic components.

In addition to the improved cooling and noise performance by sealing the electronic components of the server within the sealed first and second enclosures, the capacity of contaminants from the environment within which the server is deployed affecting their performance is diminished. As a result of this isolation of the components from their actual deployment location, it is possible to deploy servers per the present teaching in traditionally more challenging environments than heretofore possible. The server units of the present teaching can be deployed in an outdoor environment as they can for example be IP67 rated—they are sealed units and can therefore be deployed externally of server farmers, data centres and the like. Edge deployments providing server processing capabilities are therefore enabled. They can also be used within data centres whose actually room temperatures do not have to be as controlled as conventional data centres.

The words comprises/comprising when used in this specification are to specify the presence of stated features, integers, steps or components but does not preclude the presence or addition of one or more other features, integers, steps, components or groups thereof.

It should be noted that various changes and modifications to the presently preferred embodiments described herein will be apparent to those skilled in the art. Such changes and modifications may be made without departing from the spirit and scope of the present invention and without diminishing its attendant advantages. Further, references throughout the specification to "the invention" are nonlimiting, and it should be noted that claim limitations presented herein are not meant to describe the invention as a whole. Moreover, the invention illustratively disclosed herein suitably may be practiced in the absence of any element which is not specifically disclosed herein.

We claim:

1. A server unit comprising a plurality of electronic components including at least one fan, memory and a central processing unit, the server unit comprising a first enclosure and a second enclosure, the at least one fan, the memory and the central processing unit, CPU, being provided within the first enclosure, the first enclosure being provided within second enclosure, the second enclosure being sealed such that ambient air does not ingress or degress from the second enclosure, the first enclosure comprising air conduits to allow a passage of fan assisted air from the first enclosure to the second enclosure, and from the second enclosure to the first enclosure, and wherein:

the server unit further comprises an air liquid heat exchanger located in an air flow path between the first enclosure and the second enclosure such that heated air passing between the first enclosure and the second enclosure passes through the air liquid heat exchanger to effect an extraction of the heat from the heated air, the air liquid heat exchanger being in fluid communication with a liquid coolant conduit, the liquid coolant conduit being configured to effect a transfer of heat from the air liquid heat exchanger to a location externally of the second enclosure; and the first enclosure further comprises a liquid cooling unit configured to direct liquid onto the central processing unit, the liquid cooling unit being in fluid communication with the liquid coolant conduit, such that heat emitted from the central processing unit is also transferred into the liquid coolant conduit; and, wherein the server unit further comprises a third enclosure, the third enclosure being isolated from the first and second enclosures such that air does not pass between the third enclosure, and each of the first and second enclosures, the third enclosure comprising a heat exchanger in fluid communication with the liquid cooling conduit.

2. The server unit of claim 1 wherein the second enclosure comprises at least one baffle to preferentially direct air egressing from a first end of the first enclosure to then enter into a second end of the first enclosure.

3. The server unit of claim 1 wherein the liquid cooling unit comprises a jet impingement plate.

4. The server unit of claim 1 wherein the heat exchanger of the third enclosure is a fan assisted heat exchanger configured to vent heated air externally of the third enclosure.

5. The server unit of claim 1 wherein the liquid cooling conduit is coupled to a pump.

6. The server unit of claim 5 wherein pump is configured to effect a pumped movement of the fluid through the liquid cooling conduit through a flow and return circuit the flow circuit delivering heated fluid from the first and second enclosures to the heat exchanger, the return circuit returning cooled liquid from that heat exchanger back into the first and second enclosures.

7. The server unit of claim 1 wherein the second enclosure is IP67 rated.

8. The server unit of claim 1 wherein the at least one fan of the first enclosure is provided adjacent an air inlet of the first enclosure, the at least one fan configured to induce an air flow over electronic components within the first enclosure.

9. The server unit of claim 8 wherein the at least one fan is configured to induce the air flow onto the air liquid heat exchanger located in the air flow path between the first enclosure and the second enclosure.

10. The server unit of claim 1 wherein the second enclosure is hermetically sealed.

11. The server unit of claim 10 wherein each of the first enclosure and the second enclosure are filled with an inert gas.

12. The server unit of claim 1 comprising a plurality of liquid cooling units, each liquid cooling unit providing dedicated cooling for an individual electronic component.

13. The server unit of claim 1 wherein an external surface of the unit provides Radio Frequency, RF, shielding to internal electronic components.

14. The server unit of claim 1 wherein the liquid coolant conduit is in fluid communication with an external cooling system.

15. The server unit of claim 14 wherein the external cooling system is a vehicle cooling system.

16. The server unit of claim 1 wherein the unit is configured such that when it is orientated in a vertical configuration the third enclosure is provided above the second enclosure.

17. The server unit of claim 1 comprising a mounting bracket to facilitate a mounting of the unit to an external fixture.

18. The server unit of claim 17 wherein the fixture is a pole.

19. The server unit of claim 1 wherein the unit is configured such that when it is orientated in a horizontal configuration the third enclosure is provided to one side and extends along the length of the second enclosure.

20. An edge computing server unit comprising a plurality of electronic components including at least one fan, memory and a central processing unit, the server unit comprising:

a sealed first enclosure, the first enclosure being sealed such that ambient air does not ingress or degress from the first enclosure, the at least one fan, the memory and the central processing unit, CPU, being provided within the first enclosure, and wherein the first enclosure further comprises a liquid cooling unit configured to direct liquid onto the central processing unit, the liquid cooling unit being in fluid communication with a liquid coolant conduit, such that heat emitted from the central processing unit is transferred into the liquid coolant conduit; and a second enclosure, the second enclosure being isolated from the first enclosure such that air does not pass between the second enclosure and the first enclosure, the second enclosure comprising a heat exchanger in fluid communication with the liquid cooling conduit, wherein the heat exchanger comprises a fan configured to vent heated air externally of the second enclosure, and a mounting arrangement configured to facilitate a mounting of the server unit to a telecommunications pole or mast; and, wherein the first enclosure is provided within a third enclosure, the third enclosure being sealed such that ambient air does not ingress or degress from the third enclosure, the first enclosure comprising air conduits to allow a passage of fan assisted air from the first enclosure to the third enclosure, and from the third enclosure to the first enclosure.

* * * * *